United States Patent
Bank et al.

(10) Patent No.: US 7,319,763 B2
(45) Date of Patent: Jan. 15, 2008

(54) POWER AMPLIFICATION FOR PARAMETRIC LOUDSPEAKERS

(75) Inventors: Jeevan G. Bank, San Diego, CA (US); James J. Croft, III, Poway, CA (US)

(73) Assignee: American Technology Corporation, San Diego, CA (US)

( * ) Notice: Subject to any disclaimer, the term of this patent is extended or adjusted under 35 U.S.C. 154(b) by 306 days.

(21) Appl. No.: 10/332,659

(22) PCT Filed: Jul. 11, 2001

(86) PCT No.: PCT/US01/21749

§ 371 (c)(1), (2), (4) Date: Oct. 3, 2003

(87) PCT Pub. No.: WO02/05588

PCT Pub. Date: Jan. 17, 2002

(65) Prior Publication Data

US 2004/0047477 A1   Mar. 11, 2004

(51) Int. Cl.
- H04B 3/00   (2006.01)
- H04B 5/00   (2006.01)
- H04R 27/00  (2006.01)
- H03F 3/38   (2006.01)
- H03F 1/04   (2006.01)
- H03F 3/217  (2006.01)

(52) U.S. Cl. ............... 381/77; 330/10; 330/207 A; 330/251; 381/82; 381/79

(58) Field of Classification Search .......... 381/77, 381/79, 82, 120; 310/316.01; 330/10, 251, 330/207 A See application file for complete search history.

(56) References Cited

U.S. PATENT DOCUMENTS

| | | | |
|---|---|---|---|
| 3,566,037 A * | 2/1971 | Fichtner | 381/11 |
| 3,723,755 A | 3/1973 | Morse | |
| 4,028,637 A | 6/1977 | Gewartowski et al. | |
| 4,042,890 A | 8/1977 | Eckerle | |
| 4,656,440 A * | 4/1987 | Gautschi | 332/170 |
| 4,868,445 A * | 9/1989 | Wand | 310/316.01 |
| 5,343,161 A | 8/1994 | Tokumo et al. | |
| 5,859,915 A | 1/1999 | Norris | |
| 5,895,997 A * | 4/1999 | Puskas et al. | 310/316.01 |
| 5,959,501 A | 9/1999 | Chester | |
| 5,963,086 A | 10/1999 | Hall | |
| 6,297,697 B2 | 10/2001 | Delano et al. | |

(Continued)

FOREIGN PATENT DOCUMENTS

EP   0 973 149 A2   1/2000

(Continued)

Primary Examiner—Vivian Chin
Assistant Examiner—Devona E. Faulk
(74) Attorney, Agent, or Firm—Thorpe North & Western LLP

(57) ABSTRACT

A power amplifier for a parametric loudspeaker system which utilizes switch-mode power conversion to increase efficiency. The power amplifier is configured to coordinate the switching frequency of the amplifier with the carrier frequency of the parametric loudspeaker system, so a lower switching frequency may be used even though the power amplifier must amplify ultrasonic signals. The amplifier can be further optimized to counteract the reactance of the transducer load at the carrier frequency.

24 Claims, 16 Drawing Sheets

U.S. PATENT DOCUMENTS

| | | | |
|---|---|---|---|
| 6,678,381 B1 * | 1/2004 | Manabe | 381/77 |
| 6,914,991 B1 * | 7/2005 | Pompei | 381/111 |
| 2001/0007591 A1 | 7/2001 | Pompei | |

FOREIGN PATENT DOCUMENTS

| | | |
|---|---|---|
| EP | 0 973 152 A2 | 1/2000 |
| WO | WO 01/52437 A1 | 7/2001 |

* cited by examiner

POWER AMPLIFICATION FOR PARAMETRIC LOUDSPEAKERS

TECHNICAL FIELD

The present invention relates generally to parametric loudspeaker systems. More specifically, it relates to power delivery systems for parametric loudspeakers.

BACKGROUND ART

The parametric loudspeaker is an electroacoustic system that operates by producing an ultrasonic carrier frequency, for example 40 kHz, that is then modulated by an audio input signal. The modulation shifts the audio frequency up to the frequency of the carrier plus the audio frequency. This upshifted frequency (f1) interacts with the carrier frequency (f2) thus generating an audible reproduction of the audio input signal by driving the air to non-linearity which produces the audible signal of interest (f1−f2) plus other components (such as f1+f2). The ultrasonic upper frequency requirement of a parametric system is typically at least 60 kHz because this allows 20 kHz of the audio signal to be modulated on top of the 40 kHz carrier signal.

Historically, the use of parametric loudspeakers has been limited. This is partially due to their general inefficiency because the sound output is based on a second order effect of the demodulation of ultrasonic sound waves in the air into audible sound. This second order effect needs a greater amount of power to drive the system and deliver the audio output.

Parametric power delivery systems also have further reduced efficiency because the parametric system requires a continuous carrier frequency output At full audio output, the carrier frequency is operated at a constant ¼ power output level, which causes high power dissipation in the amplifier. Even at lower audio levels or during a break in the music the carrier signal must be driven at high constant power levels.

Further, most parametric loudspeaker transducers exhibit highly reactive loads. In the prior art, parametric transducers are driven using a conventional linear power amplifier to directly drive the transducer, and they require very large power amplifiers that dissipate significant power and heat in the output stage.

Due to the high continuous power levels that can be required, the transducers that work best for parametric or ultrasonic loudspeakers tend to have dominantly reactive (capacitive and/or inductive) characteristics. This is in contrast to conventional electromagnetic speakers which tend to have a dominant resistive characteristic. One of the reasons for using reactive speakers in a parametric system is that the high average level of the carrier frequency can cause high thermal dissipation in the resistive element of any transducer. A purely reactive transducer dissipates very little heat in the device itself because of the reactive load it provides to the amplifiers. Correspondingly, the output stage of the power amplifier (particularly a linear amplifier) coupled to a reactive transducer or speaker has significant thermal losses. These losses are caused because the power amplifier must amplify highly reactive charging currents when driving the reactive load directly. The problem is particularly detrimental at the frequencies of greatest output, such as the carrier frequency and frequencies associated with lowest audio frequencies to be reproduced.

A related major issue with prior art parametric loudspeakers is that the reactive load transducers require significant reactive charging power. In turn, that power requirement has forced the use of much higher output power amplifiers to supply this wasteful power.

Prior art parametric loudspeakers have used what is commonly known in the art as a linear or Class B amplifier topology which reaches maximum efficiency at full power and is at its most thermally inefficient mode at the ¼ power level or the equivalent half voltage level. As an example, a 100 watt Class B amplifier when operating at ¼ power may dissipate 50 watts into wasted heat while outputting only 25 "useful" watts to the load. This is both an inefficient waste of power and a costly system to build because it can require extensive cooling systems.

A serious contributor to the inefficiency of a linear power amplifier in a parametric system is the fact that the common transducer type used in parametric loudspeakers has a reactive impedance that must be driven by the power amplifier. It is well known that linear amplifiers have a significant reduction in efficiency and increase in heat when driving a reactive load. Accordingly, it is desirable to provide a system which would allow a more efficient use of amplifier power in a parametric speaker system.

SUMMARY OF THE INVENTION

The invention provides a parametric loudspeaker power amplifier to provide improved power efficiency in a parametric loudspeaker system. The power amplifier includes a switching power stage, and at least one transducer coupled to the power amplifier. Reactive circuit elements are also coupled between the switching power stage and at least one transducer. A carrier frequency, modulated with an audio frequency range such that the carrier frequency and sidebands, divergent from the carrier frequency and corresponding to the operating frequency are amplified by the switching power stage and reproduced by the transducer.

In accordance with one embodiment of the present invention, the system includes a switch-mode power amplifier wherein the switching frequency of the switch-mode power amplifier is substantially an integer multiple of a carrier frequency of the parametric loudspeaker system.

In accordance with another embodiment of the present invention, the invention includes a method for improving power efficiency in a parametric loudspeaker power amplifier. The first step is generating a pulse width modulated (PWM) signal. Next, a parametric signal having a carrier frequency and audio related sideband signals is amplified using the PWM signal. Another step is delivering the parametric signal to at least one transducer having at least one resonant frequency and a reactive load. The final step is counteracting or counterbalancing the reactive load in the transducer using reactive circuitry elements.

Additional features and advantages of the invention will be set forth in the detailed description which follows, taken in conjunction with the accompanying drawings, which together illustrate by way of example, the features of the invention.

DETAILED DESCRIPTION

Figure 1:
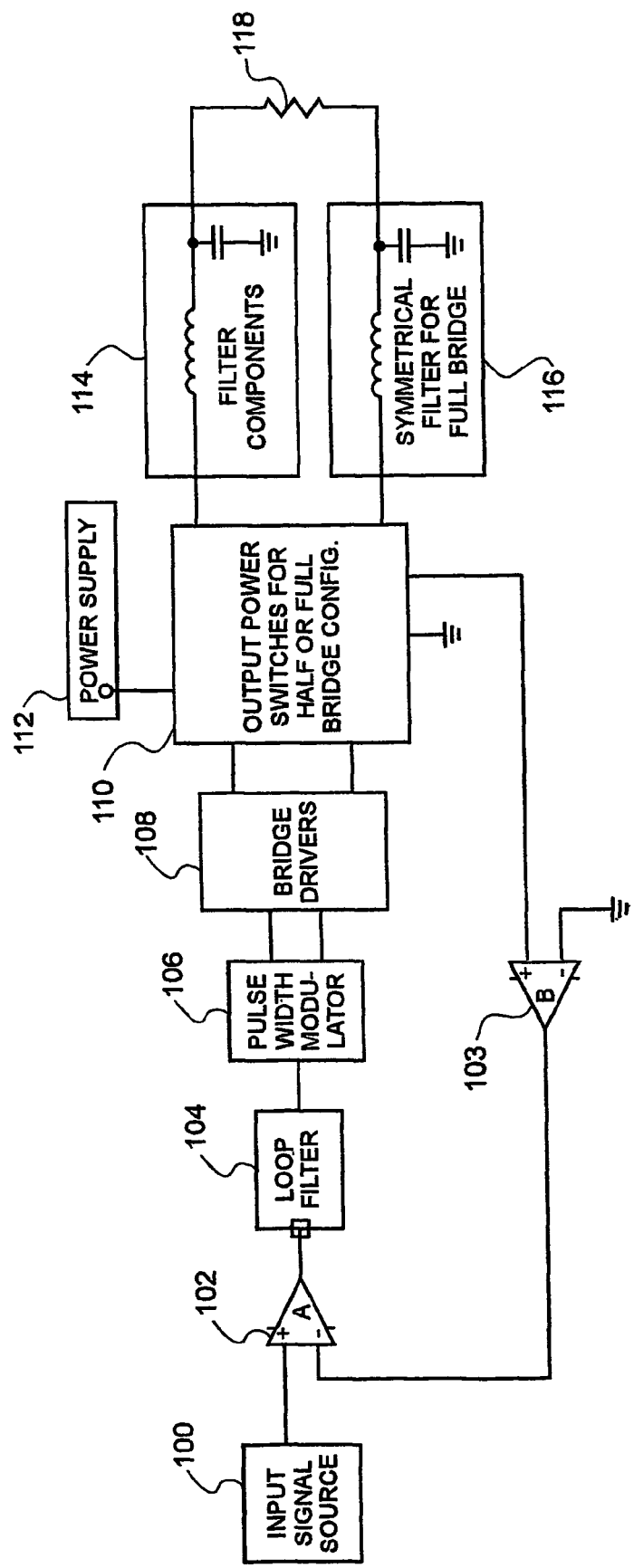
FIG. 1 is a block diagram of a Class D pulse width modulation amplifier.

For the purposes of promoting an understanding of the principles of the invention, reference will now be made to the exemplary embodiments illustrated in the drawings, and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

Since the normal operating mode of a parametric loudspeaker can be ¼ output power even at idle, and the transducers used in parametric loudspeakers usually have a significant reactive component in their load impedance, conventional linear amplifiers tend to operate inefficiently in parametric loudspeaker systems. As a result of the problems described before, it can be seen that a major contributor to the inefficiency of prior art parametric systems has been the linear Class B amplification systems used.

Another type of amplifier is a switch-mode or Class D power amplifier. This amplifier uses a switching output stage whose output power signal is in either an "on" or "off" condition as opposed to the linear signal mode of a Class B design. With a switch-mode power amp, the efficiency is very high and the efficiency can be maintained even with a reactive load. This technology has been known to improve the efficiency of low frequency systems significantly but has only recently been capable of operating effectively with audio devices up to 20 kHz (i.e., maximum audible frequencies). Even then, it has been difficult to operate without greater distortion or high frequency response errors, even at frequencies below 20 kHz when used with capacitive transducers.

FIG. 1 illustrates one embodiment of a Class D power amplifier or a pulse width modulation (PWM amplifier in a parametric system with output filtering before the signal is sent to the load or transducer. An input signal source 100 is provided to an error amplifier 102 which receives an inverting input from a feedback amplifier 103 to control signal gain. The signal is then provided to a loop filter 104 which can be a lag-lead filter to stabilize the feedback loop. A pulse width modulator 106 is included to generate, control, and vary the pulse width or length of the pulses generated. Bridge drivers 108 control the switching of the output power switches 110. The bridge drivers and pulse width modulator can be combined into one integrated chip or reside on separate chips as depicted. The output power switches receive power from the power supply 112 and deliver a switched amplification signal using either a half or full bridge switching configuration. Filter components 114 are used to convert the pulse width modulation to an analog signal and to reduce the switching noise. One set of filters is needed if a half bridge switching configuration is used and a second set of symmetrical filters 116 is used if a full bridge switching configuration is used. A transducer load 118 is shown connected to the filter components.

One issue with prior art Class D power amplifiers is for the high frequency performance of the amplifier to equal or even approach that of a Class B design, the switching frequency is required to be at least 10 to 25 times the highest frequency to be reproduced and preferably even greater. This is a difficult design criteria to meet even with an audio signal bandwidth of only 0-20 kHz, because it requires a switching frequency of 200 kHz to 500 kHzClass D amplifiers with this frequency range have been used but not with extensive success.

Using even higher switching frequencies to achieve greater performance is desirable from the standpoint of linearity, output impedance, and lower cost filter design, but higher switching frequencies are prohibitive from the standpoint of switching losses and thermal dissipation. In fact, some Class D amplifiers where higher switching frequencies (above 400 kHz) have been attempted have resulted in amplifiers that are as inefficient as a standard Class B amplifier.

Another issue with prior art Class D amplifiers is that they generally use one or more LC filters on the output to produce a linear signal. These LC filters are designed to have a large enough value to minimize the switching noise of the Class D amplifier while at the same time having the conflicting requirement to be small enough to not interact with the loudspeaker load at high audio frequencies.

Yet another problem with prior art Class D switching amplifiers is that they can recycle energy from the power supply to the load and then back into the power supply again. Because of this issue most Class D amplifiers must use a bridged output stage that has twice as many power transistors, drivers, rectifiers and output filters. If this configuration is not used, then it is possible to have energy flow from a positive power supply terminal to the load and recycle back into the negative power supply. This recycling can produce an overvoltage and cause a catastrophic overvoltage condition. Either the more costly bridged output topology or else a complex power supply balancing system may be required.

Despite the drawbacks of a Class D amplifier, it is desirable to use in a parametric loudspeaker system because of the amplifier efficiency increase in general, and in particular with reactive loads because of the efficiency increase at ¼ power. The minimum 10 to 25 times requirement of prior art Class D amplifiers when applied to a parametric loudspeaker system (whose highest frequency to be reproduced is usually at least 3 times higher than the audio band which is already difficult for a Class D amplifier) at 60 kHz requires the switching frequency of the Class D power amplifier to be 600 to 1500 kHz. These high switching frequencies can be difficult and expensive to realize when using Class D amplifiers. An additional drawback with a more expensive and complex Class D amplifier is when it is used to produce 600-1500 kHz frequencies, the efficiency of the Class D amplifier degrades and a significant power loss may be produced that approaches a linear amplifier. Using a Class D amplifier at ultrasonic frequencies can increase the cost and complexity of an amplifier system, without retaining the efficiency of Class D amplifiers utilizing a lower switching frequency. As can be seen, it would be valuable to utilize the efficiency of a Class D amplifier in a parametric loudspeaker system while still maintaining the efficiency available at its lower switching frequencies.

Figure 2:
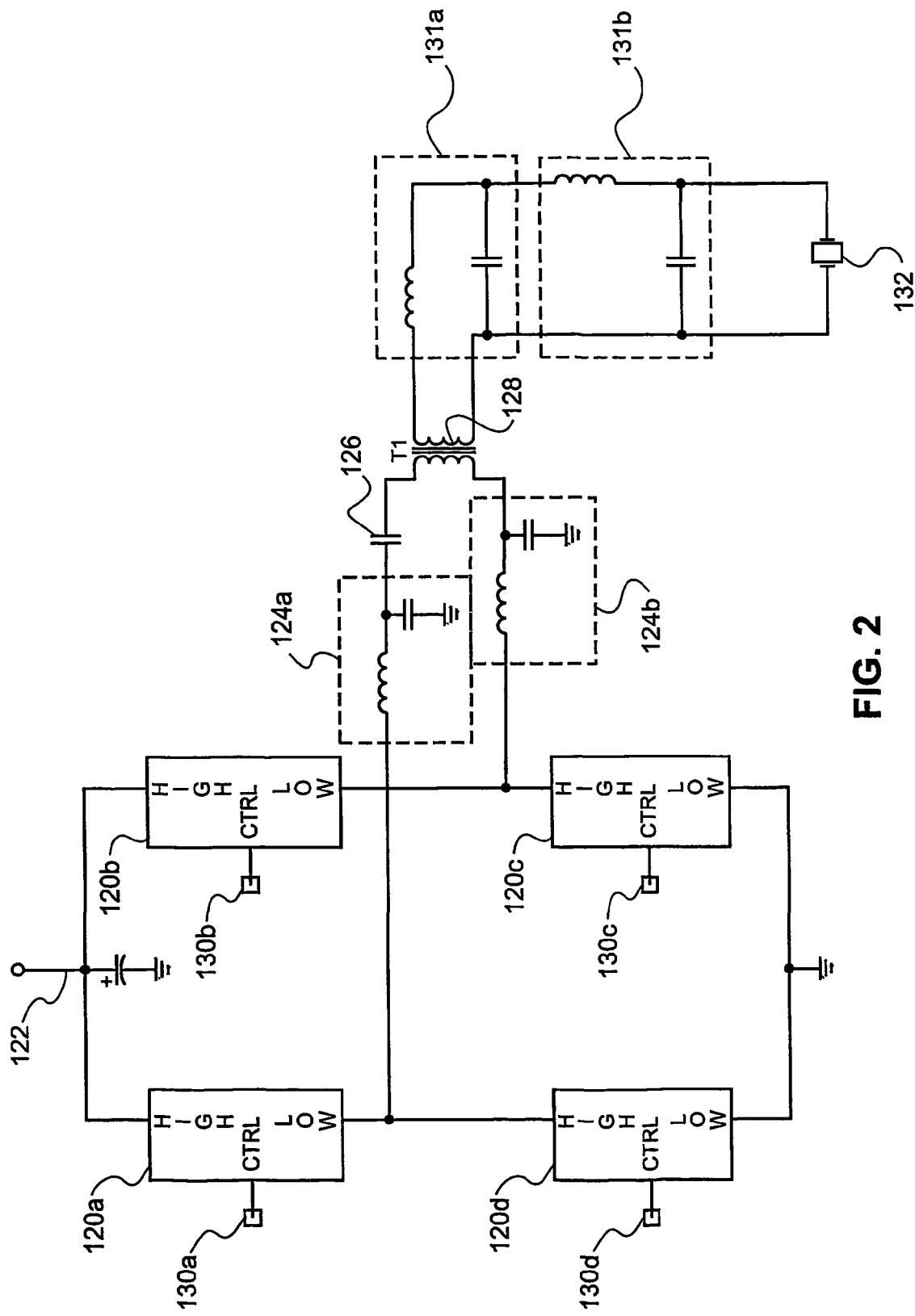
FIG. 2 is a schematic of a parametric loudspeaker system with a H-Bridge amplifier, output filtering, and transformer load coupling.

As illustrated in FIG. 2, a parametric loudspeaker system includes a Class D amplifier with a H-bridge amplifier, output filtering, and a transformer load coupling. Four switching power devices are shown as 120a-120d which switch the power received from the power source line 122. A number of pulse driver lines 130a-130d are connected to the bridge drivers to drive the switching devices. The switch devices can be MOSFETs, high speed bipolar transistors or another fast power switching device known in the art. A typical voltage component rating for use in this system is a 60 V MOSFET. Higher voltage MOSFETs can be used, such as 200 V, but these are more expensive.

Two switch filters 124a and 124b are also used in the full bridge configuration to filter out the high frequency switching noise. A capacitor 126 is included to filter out any DC signal. To match the voltage to the transducer 132, a transformer 128 is used to step-up or step-down the voltage provided by the switching devices 130a-d. A transformer is especially helpful where an ultrasonic signal will be produced because the ultrasonic transducer can require higher voltages or higher currents than the direct output for which the amplifier is optimized. Of course, it is possible to omit the transformer and match high voltage power devices (e.g., MOSFETs, etc.) to the high voltage transducer but this depends on which method is desired. Two pairs of two pole filters 131a and 131b are included to provide further high frequency filtering and/or they can be tuned for reactive load matching.

Figure 3:
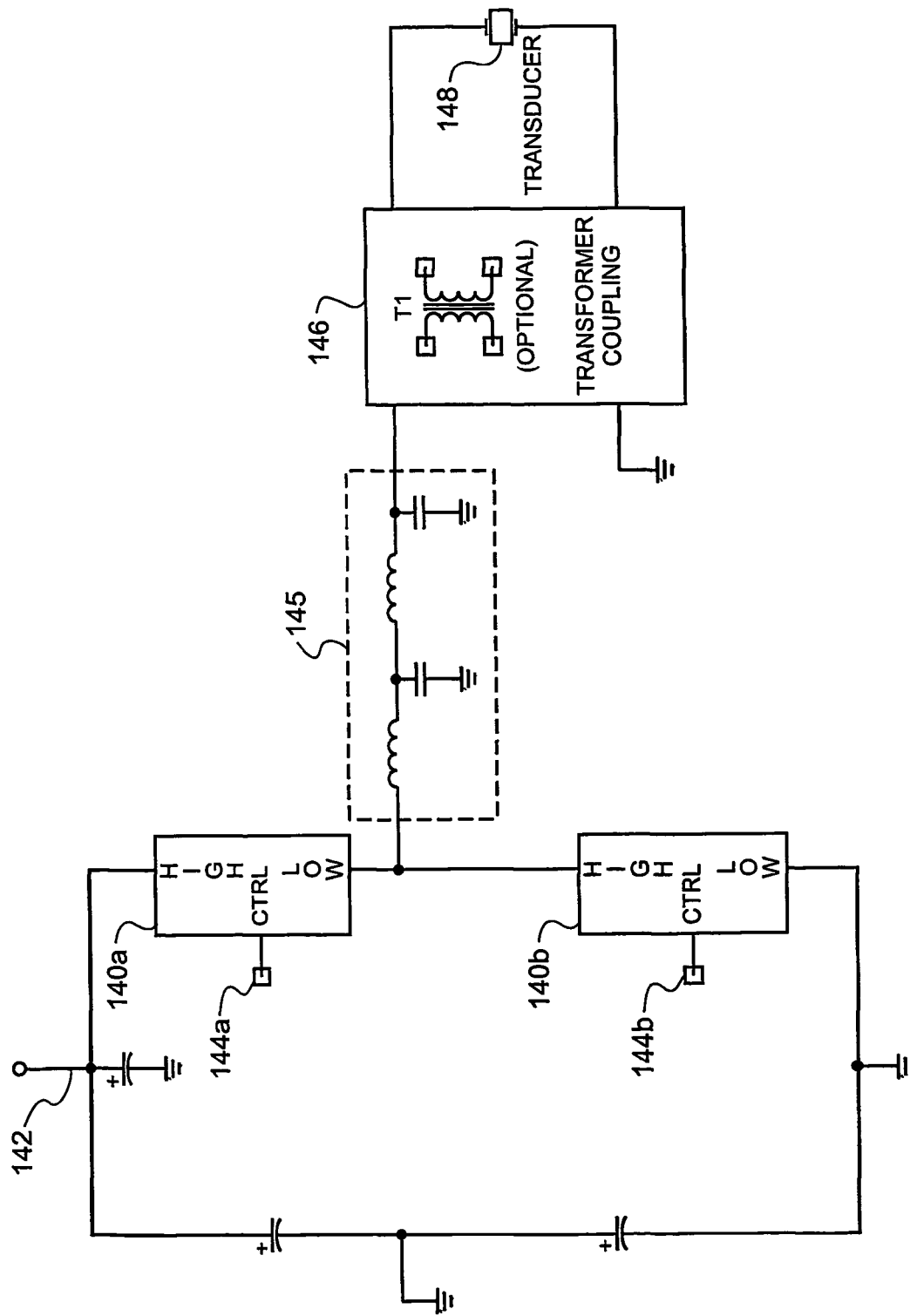
FIG. 3 is a schematic of a half bridge amplifier with output filtering.

FIG. 3 is a schematic of a half bridge amplifier with output filtering. Two switching power devices are shown as 140a and 140b which switch the power received from the power source line 142. Pulse driver lines 144a and 144b are each connected to the bridge drivers to drive the switching devices. The switch devices can be MOSFETs, high speed bipolar transistors or similar fast power switching devices known in the art. In a full bridge configuration, a four pole filter 145 is included to filter out the high frequency switching noise. Additionally, a transformer coupling can be located between the Class D amplifier and the transducer 148 to match the output of the amplifier to the impedance of the transducer.

Figure 4:
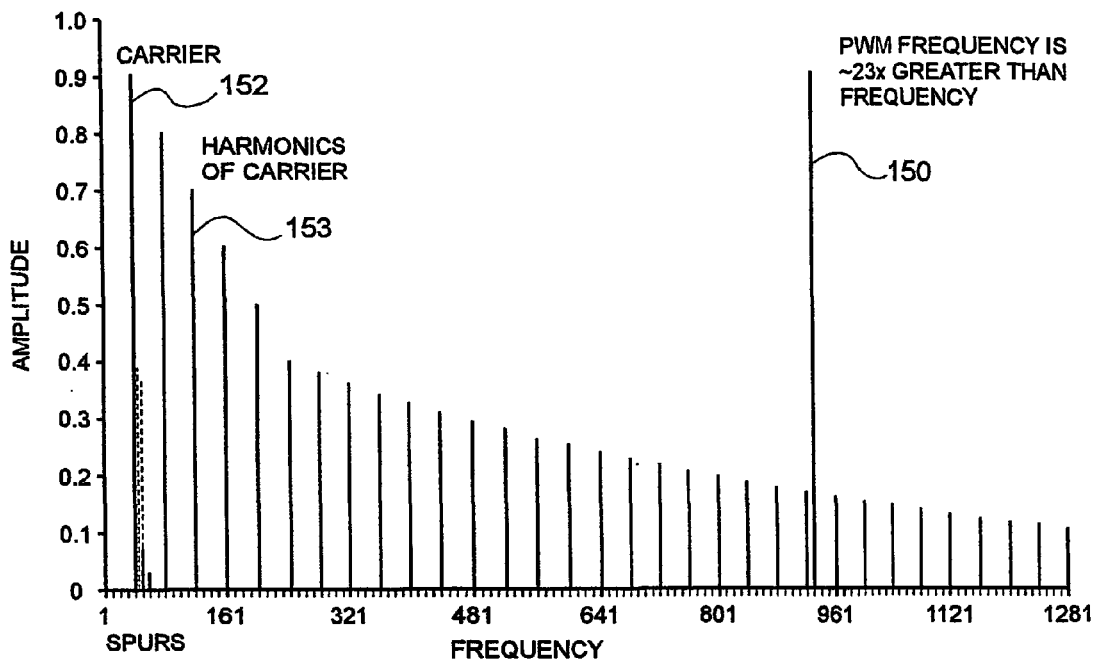
FIG. 4 is a graph of the pulse width modulation (PWM) frequency at approximately 23 times the carrier frequency.

FIG. 4 is a chart illustrating a pulse width modulation frequency 150 that is approximately 20-25 times greater than the carrier frequency signal 152 or a frequency of 800 kHz to 1 MHz. An ultrasonic signal uses a carrier signal above 20 kHz. The preferred carrier frequency is 30 to 60 kHz and that is modulated with audio signal sidebands which can add another 15 or 20 kHz to the frequency. A Class D power amplifier uses a switching frequency approximately 20 times or more than the highest reproduced frequency, and this requires switching frequencies of 1.2 MHZ or more which are not practical with present switch-mode or Class D technology. If a lower switching frequency is used, distortion is created within the audio related sideband which produces distorted audible sounds and/or a greater potential for more filter interaction because larger filters must be used to filter these lower distortion frequencies. Moreover, frequency response anomalies can be created when a lower switching frequency is used due to the interaction between filters and the loudspeaker load.

Figure 5:
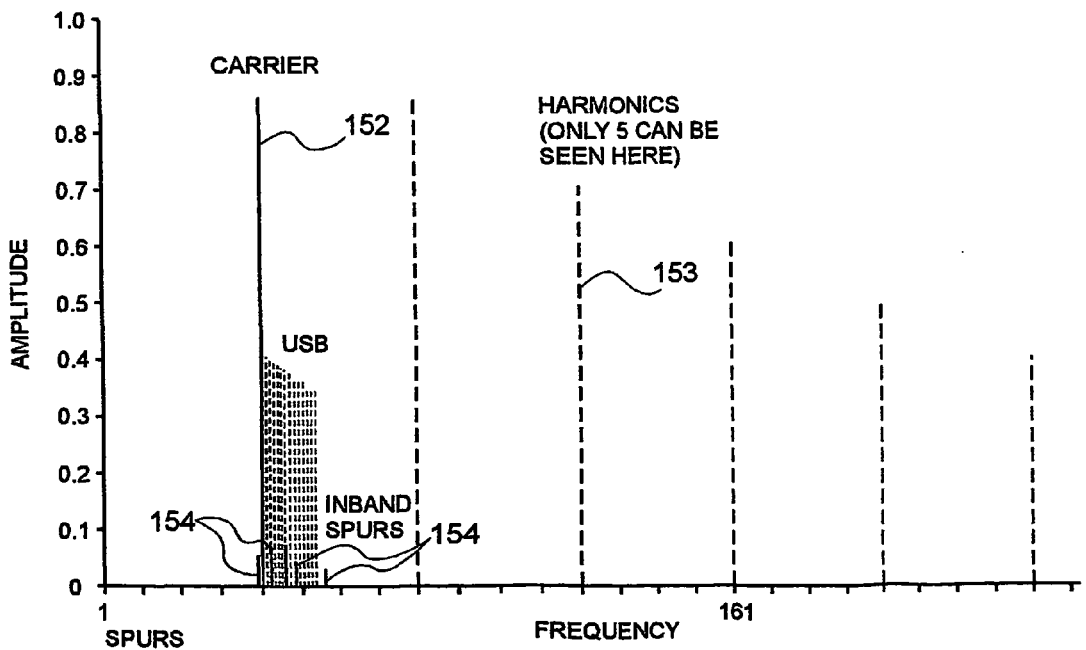
FIG. 5 is a graph of distortion frequencies created by the PWM frequency in FIG. 4.
Figure 6:
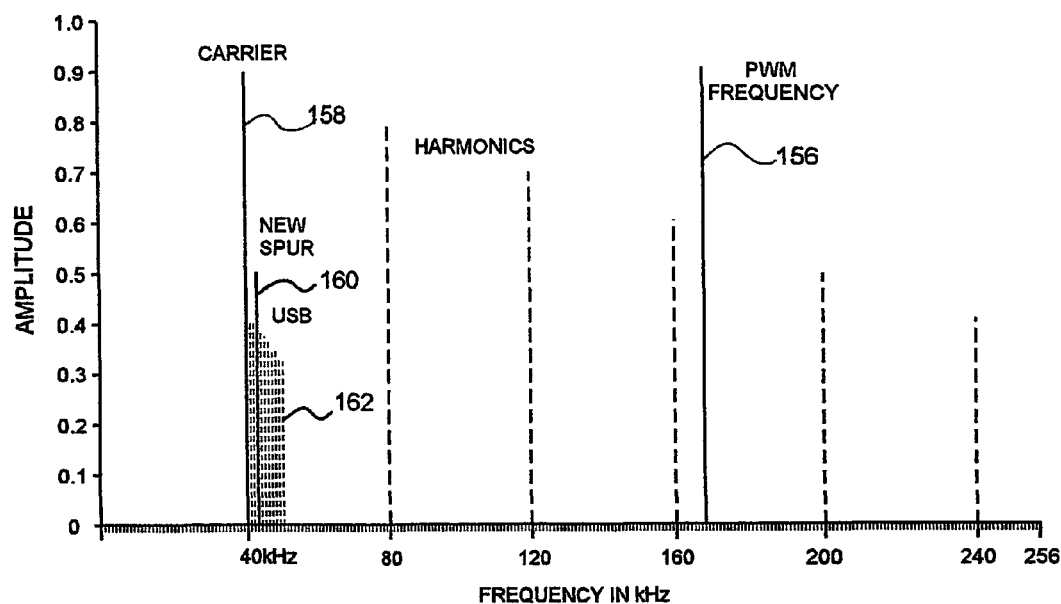
FIG. 6 illustrates a frequency spectrum graph with a non-synchronous pulse width modulation frequency that creates distortion in the upper side band of the audio.

Referring again to FIG. 4, the harmonics 153 which are an integer multiple of the carrier wave are also shown. FIG. 5 illustrates a close-up view of the carrier frequency in FIG. 4 with the harmonics 153 shown as dotted lines. When the pulse width modulation (PWM) frequency is at a level that is less than 25 times greater than the carrier, in-band distortion spurs 154 are created. These in-band distortion spurs can be heard in the audio reproduced by the parametric transducer. FIG. 6 illustrates a pulse width modulation frequency 156 at approximately 170 kHz. Even when the pulse width modulation is closer to the carrier 158, a distortion spur 160 is still created in the upper side band audio frequency 162. It should be realized that the figures illustrate single sideband (SSB) (i.e. upper sideband (USB) audio signals modulated onto the carrier but a lower side band (LSB) or double sideband (DSB) can also be used. These illustrations represent the single sideband (or upper sideband) case but the distortion spurs would be mirrored when lower or double sideband modulation is used.

Figure 7:
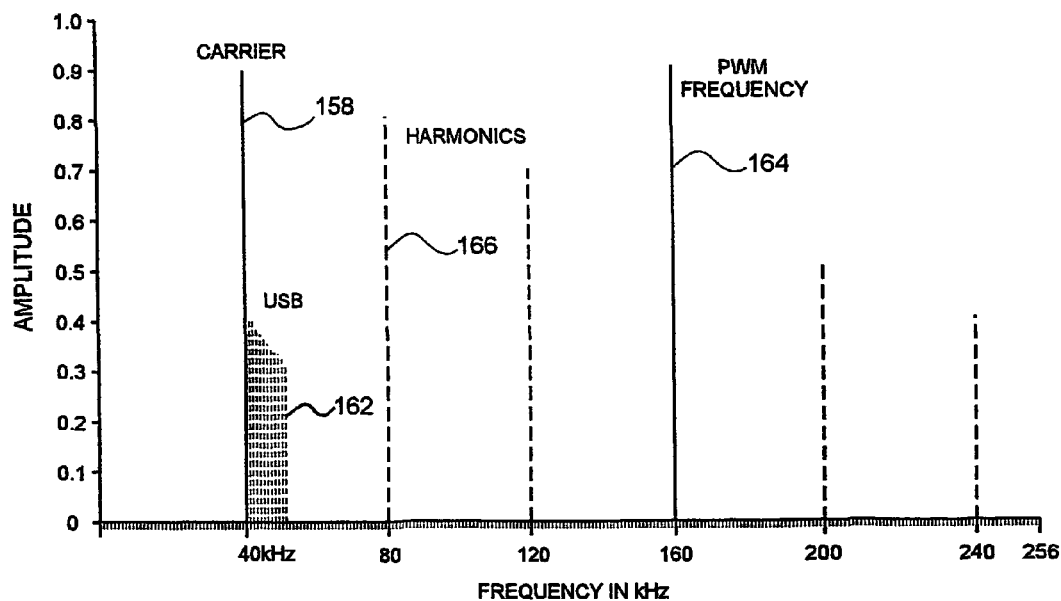
FIG. 7 illustrates a frequency spectrum graph with a synchronous PWM frequency which avoids distortion in the upper audio side band.

Instead of picking an arbitrary frequency value for the pulse width modulation, it has been discovered that it is surprisingly advantageous to use a pulse width modulation frequency that is a multiple of the carrier frequency. The valuable result is that the secondary distortion harmonics from the PWM frequency fall directly on the carrier and any other smaller harmonics coincide with higher harmonics of the carrier. FIG. 7 illustrates the situation where a PWM frequency 164 is set at a frequency of four (4) times the carrier frequency 158. Since the distortion harmonics of the PWM frequency fall outside the upper side band audio 162 (or lower side bands when provided), then no audible distortion is produced. FIG. 7 also shows other integer harmonics 166 which could be used for the PWM frequency.

Synchronization of the PWM frequency to the appropriate multiple of the carrier frequency also allows for smaller filter components since the second harmonic is canceled out without filtering. In other words, the synchronization reduces the required cut off rate and/or increases the frequency where the cut off filter must be set. A major advantage of using a PWM frequency at a harmonic of the carrier frequency is that the same Class D amplifier which is used with audio frequencies, for example 400 kHz, can also be used at 400 kHz with ultrasonic frequencies instead of the expected 800 kHz-1.5 MHz. Using synchronization also allows for tuned bandpass filtering where the frequencies below 20 kHz can be filtered out. This allows for a smaller transformer because the lower frequencies are not needed.

Although using an exact integer multiple of the carrier frequency is the most advantageous configuration, the PWM frequency can be slightly displaced from the integer multiple of the carrier without audible distortion. Even if the PWM frequency is only substantially a carrier multiple, advantageous effects are still produced. In this situation, the switching frequency of the power stage of the switch-mode power amplifier corresponds substantially to a multiple of a carrier frequency of the parametric loudspeaker system within a "frequency tolerance limit". The frequency tolerance limit is defined by a correspondence with the lowest audible frequency of operation for the parametric loudspeaker. In other words, a parametric transducer has a threshold frequency below which it cannot effectively reproduce audible sound. Distortion products produced by the PWM below that threshold frequency are not audible. This lowest audible frequency is often between 200 Hz to 400 Hz or less and the distortion components associated with the frequency tolerance limit are less than the lowest audible frequency of operation. The frequency tolerance limit $T_L$ is less than or equal to the multiple of the carrier (xC) times the lowest frequency limit (LFL). This can also be written as:

$$T_L<(xC)*LFL$$

So, if the multiple of the carrier is 3 and the lowest audible frequency is 300 Hz, then the frequency tolerance limit is 900 Hz. This is the maximum amount which the PWM may be shifted off the harmonic without audible distortion.

An example of this is using a 100 kHz carrier frequency and a switching PWM frequency at 400 kHz to amplify the carrier (i.e., 4 times the carrier). If the PWM frequency is displaced slightly off the $4^{th}$ integer multiple of the carrier (400 kHz) by 200 Hz, this creates a distortion product at 50 Hz. To determine the distortion frequency, the displacement (200 Hz) is divided by the integer multiple 4 (the PWM multiplier or (xC)). This resultant distortion at 50 Hz is not audible in a parametric speaker system that only has low frequency capability down to 200 Hz. If the displacement were 2000 Hz, then the distortion harmonic would be 500 Hz and just above the reproducible threshold which is undesirable.

Figure 8:
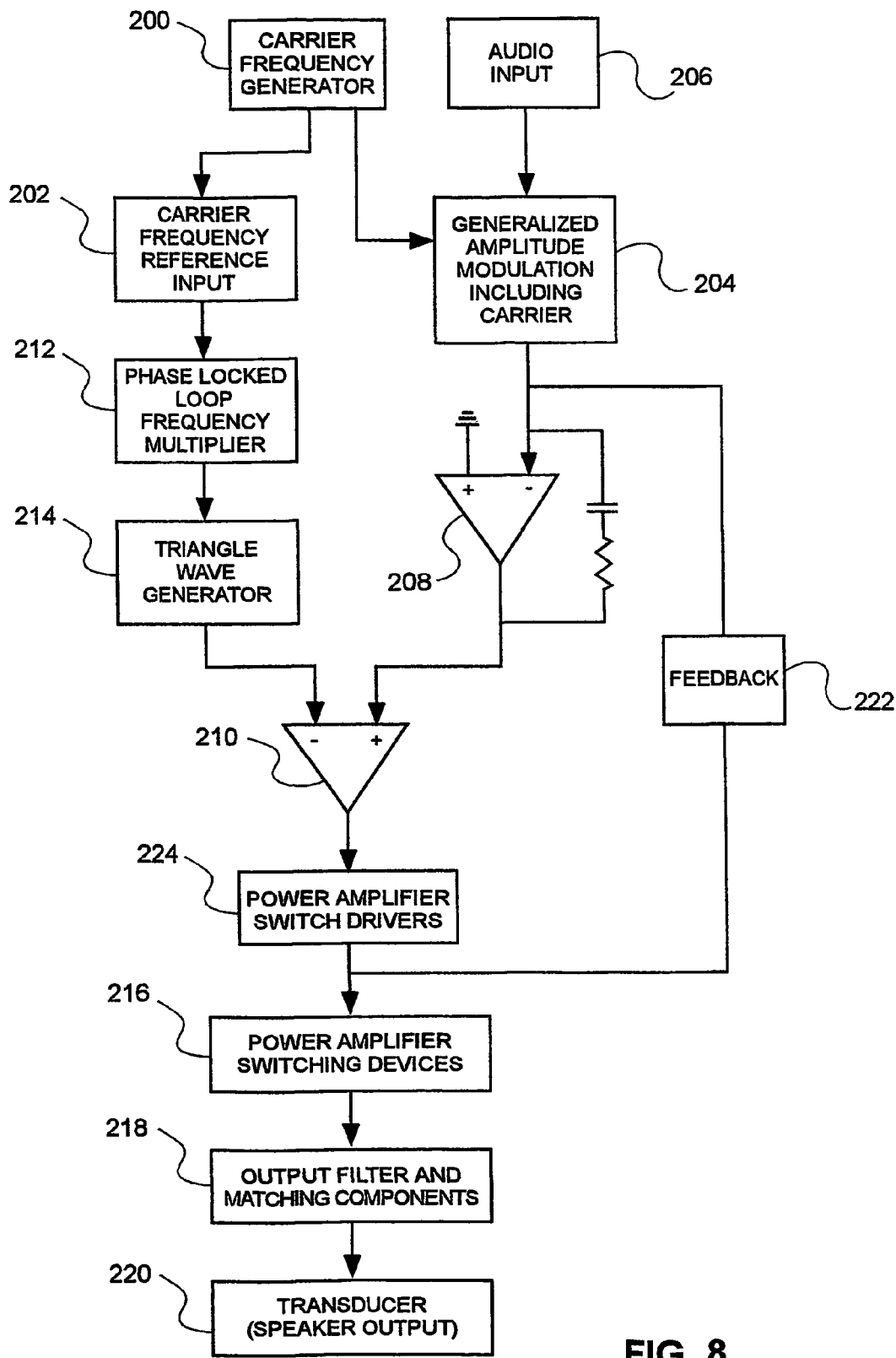
FIG. 8 is a block diagram of a parametric system with a Class D amplifier which avoids distortion spurs using a frequency multiplier to create a PWM frequency that is a selected multiple of the carrier.

FIG. 8 is a block diagram of a Class D amplifier with the required circuitry for generating a pulse width modulated (PWM) power signal at selected frequencies. First, a carrier wave frequency is generated 200. The carrier wave frequency is delivered to the carrier frequency reference input 202 and the generalized amplitude modulation (including the carrier) 204. The generalized amplitude modulation is modulated with the audio input 206 to create a carrier modulated audio signal. The carrier modulated signal passes through an error amplifier 208 before it is passed onto the comparator 210.

Concurrently, the carrier reference input is sent to the phase locked loop frequency multiplier 212 and then onto the triangle wave generator 214. The phase locked loop reference frequency is the same frequency as the carrier that is used in the modulator. Hence, the triangle wave is an integer multiple of the carrier frequency. This provides a clocking signal for the switch drivers. The signal from the triangle wave generator creates a pulsed signal (at the selected integer multiple of the carrier frequency) as it is passed to the comparator 210 along with the signal from the error amplifier 208. This signal is then passed to the power amplifier switch drivers 224 which in turn control the power amplifier switching devices 216. The switching devices can be MOSFET switches in a half or full bridge configuration. A feedback loop 222 is also provided to control the signal gain. After the PWM power signal has been generated, an output filter 218 is used to remove the high frequency switching noise. Matching reactive components 218 are also included which will be discussed later. The final ultrasonic signal is delivered to the transducer 220 which emits the composite acoustic waves.

Figure 9:
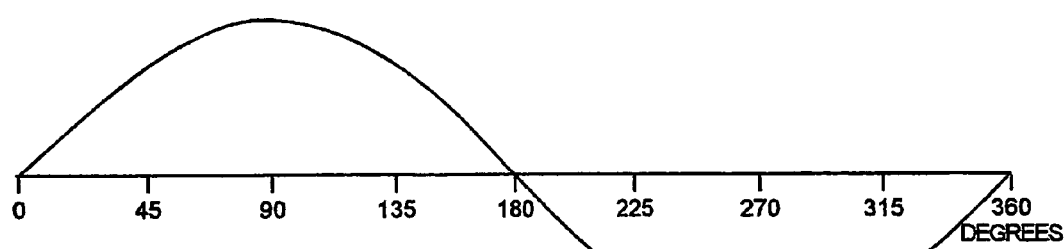
FIG. 9 illustrates the generation of an ideal signal sine wave.

A pulse width modulation (PWM) amplifier must reproduce an analog wave containing audio information as accurately as possible. A perfect sine wave is illustrated by FIG. 9. There are two common types of PWM architecture. One type of PWM is called bipolar modulation because the pulses for each part of the sine wave are created with only two levels. In other words, there is a high level and a low level but no mid-level. The other type of PWM is unipolar modulation where only positive pulses referenced to zero are used for the positive part of the sine wave and only negative pulses referenced to zero are used for the negative part of the wave being reproduced. In other words, three states are available.

Figure 10:
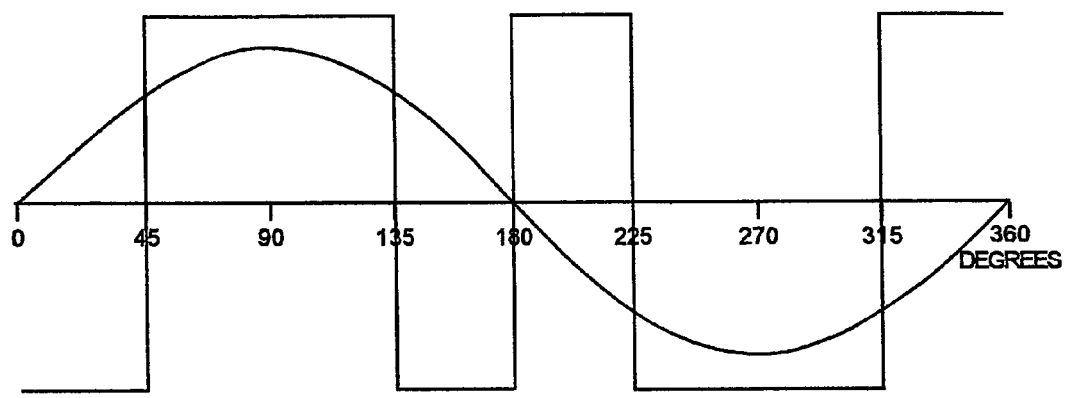
FIG. 10 illustrates the generation of a signal wave using bipolar pulse width modulation at 3 times the carrier frequency.
Figure 11:
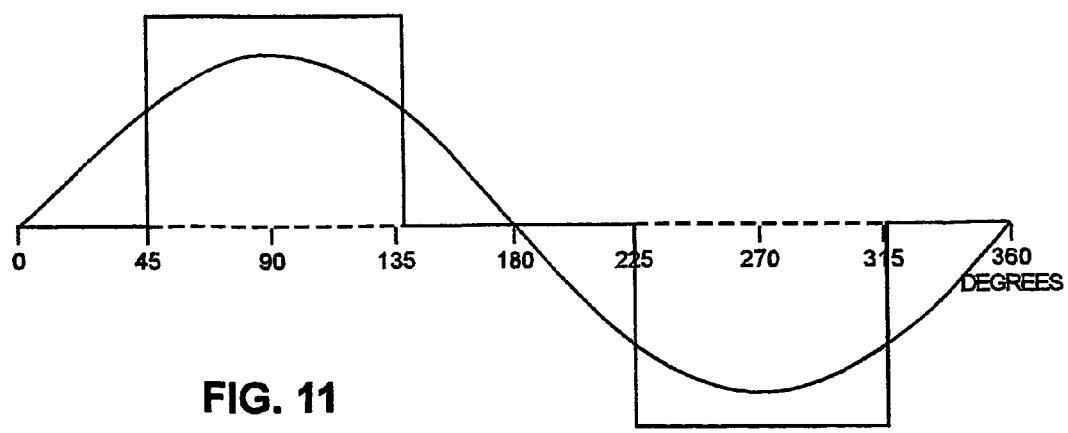
FIG. 11 illustrates the generation of a signal wave using unipolar pulse width modulation at 2 times the carrier frequency.

FIG. 10 depicts a graph of a sine wave being generated with bipolar PWM where the pulse count is an integer multiple of three (3) times the carrier wave. It is important to note that the pulses are generated symmetrically about the 180-degree point with the pulses for the negative part of the signal mirroring the positive part of the signal. In contrast, the unipolar or 3-state pulse modulation (positive, negative and zero state) only generates positive pulses for the positive part of the wave and negative pulses for the negative part of the wave. FIG. 11 illustrates pulse generation at two (2) times the carrier wave frequency. It should be noted that although a smooth wave form is shown, when the carrier is modulated with the audio signal the wave will be irregularly shaped and the appropriate pulses are delivered to reproduce a given wave form.

Figure 12:
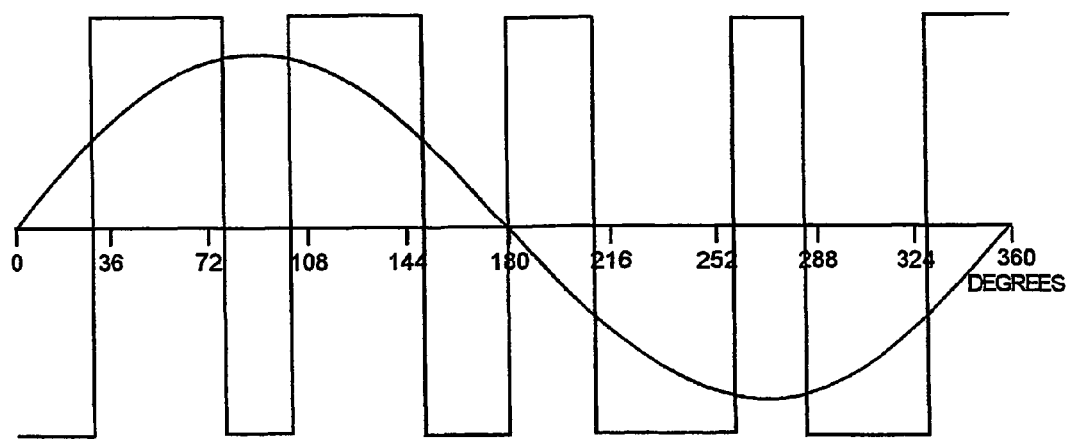
FIG. 12 illustrates the generation of a signal wave using bipolar pulse width modulation at 5 times the carrier frequency.
Figure 13:
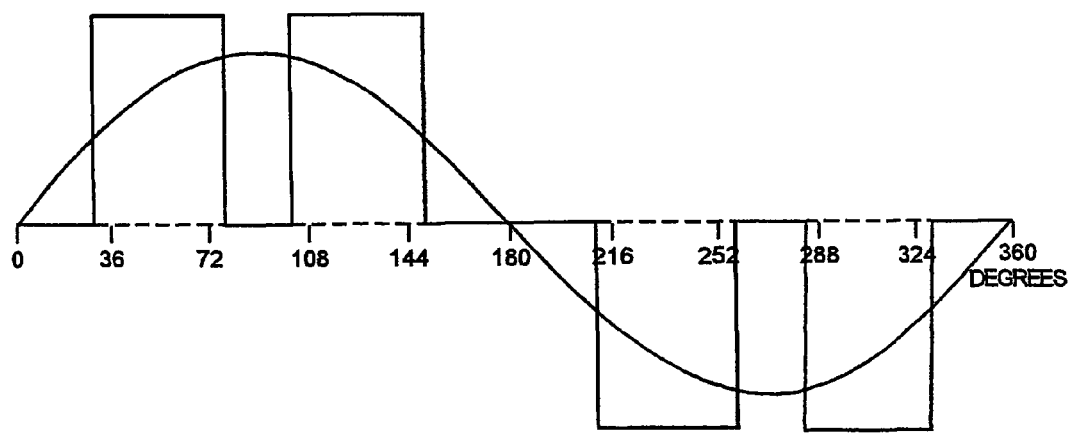
FIG. 13 illustrates the unipolar pulse width modulation at 4 times the carrier frequency.

FIG. 12 illustrates bipolar pulse width modulation (PWM) where the pulse frequency is 5 times the carrier frequency. FIG. 13 depicts a unipolar pulse width modulation where the PWM frequency is four (4) times the carrier frequency. The pulse symmetry shown between the positive and negative parts of the wave helps to cancel out the even harmonics of the carrier frequency. As described earlier, using a PWM frequency at an integer multiple of the carrier frequency solves the problem of unwanted distortion products within the audible range.

Another significant problem with parametric audio systems is that a capacitive transducer is frequently used for output. A purely capacitive load presents a difficult load to an amplifier. A large amount of energy is stored in the capacitance. This energy must be provided by the amplifier. The capacitive impedance varies widely and cycles unwanted voltage and current throughout the circuit.

Figure 14:
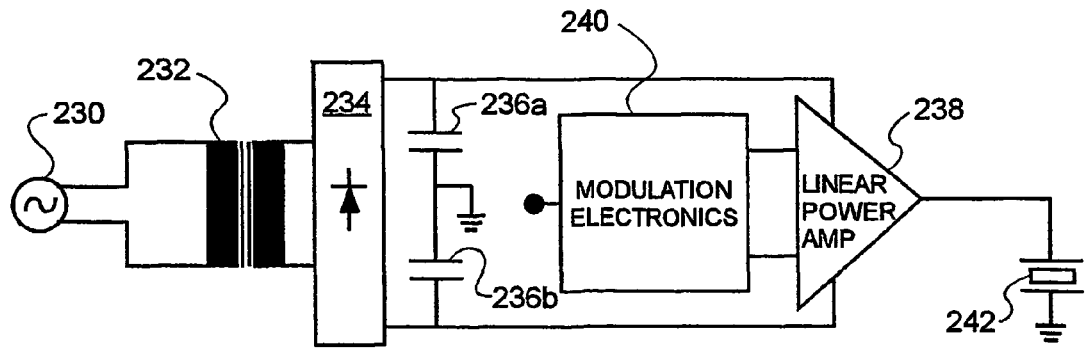
FIG. 14 is a schematic of a parametric loudspeaker system with a linear power amplifier and a power transformer.
Figure 15:
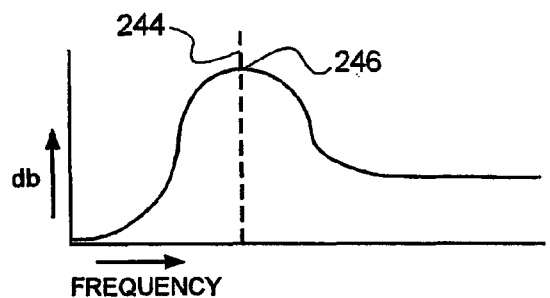
FIG. 15 is a graph of the frequency response curve for the parametric loudspeaker system in FIG. 14.
Figure 16:
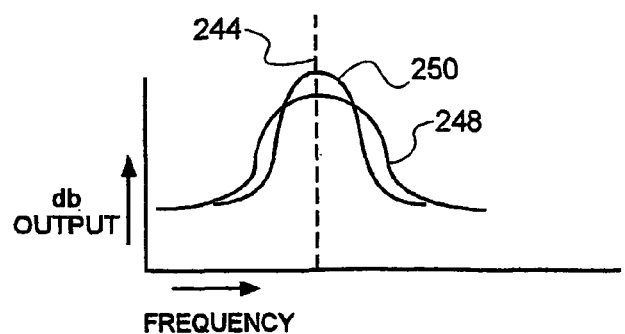
FIG. 16 is a graph of the frequency response curve for the system in FIG. 14, including the acoustic output curve.

As illustrated in FIG. 14, a power amplifier parametric speaker system is coupled to an A/C power source 230 through a step-up or step-down power transformer 232. Power is supplied to a bridge rectifier 234 which in turn supplies power to a linear power amplifier 238 through two storage capacitors for DC energy storage 236a and 236b. Modulation electronics 240 are connected to the linear power amplifier to supply an ultrasonic signal modulated with audio related sideband signals. The amplified modulated signal is supplied to a capacitive transducer 242, which in this case is a piezoelectric transducer. When the carrier frequency 244 is aligned with the transducer resonant frequency 246, as depicted in FIG. 15, an increased level of acoustic output or efficiency gain is achieved. FIG. 16 illustrates a graph of a capacitive transducer frequency response (i.e., output in decibels as compared to the audio frequency being reproduced). The first curve 248 represents the output curve of the transducer when the carrier is not placed at the resonant frequency of the transducer. The second curve 250 represents the increased acoustic output of a transducer when the carrier wave 244 is placed at the resonant frequency of the transducer. Despite this increased output, the capacitive nature of the transducer is not changed and the amplifier must dissipate a significant amount of reactive energy into heat.

Figure 17:
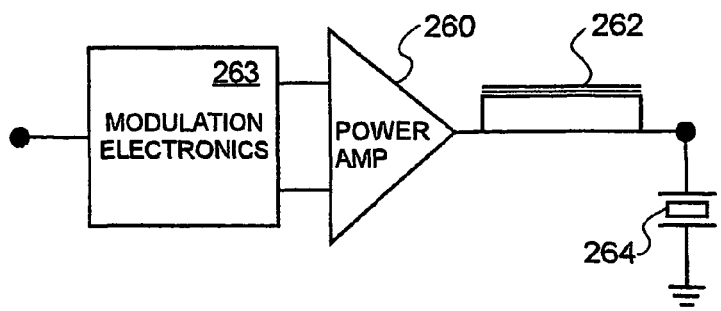
FIG. 17 is a parametric loudspeaker system with an inductor tuned to an off-resonant transducer frequency.

An additional inductance between the amplifier and the transducer improves this by providing a positive reactance which counteracts or counterbalances the negative reactance of the transducer capacitance. FIG. 17 illustrates a parametric loudspeaker power amplifier to provide improved power efficiency. The parametric loudspeaker system includes a switching power stage in the power amplifier 260, and modulation electronics 263 to supply a signal. Reactive circuitry elements are coupled between the switching power stage and at least one transducer 264. Specifically, a series inductance 262 is coupled to the switching power stage. The switching power stage is preferably a Class D amplifier. Of course, a linear power amplifier could be used with the inductor but the Class D amplifier is significantly more efficient.

The reactive circuit elements counteract or neutralize the effects of the reactive part of the transducer load impedance and increases energy efficiency. The reactive energy storage components provide reactive power that is stored in the reactive part of the load impedance. This means the reactive matching network constantly exchanges reactive energy with the transducer which relieves the amplifier from having to provide that energy. So, the amplifier only provides the energy to drive the transducer. In addition, the reactive elements alternately exchange the reactive energy with the reactive part of the load impedance. The reactive energy is stored alternately in the reactive part of the load and then in the reactive element(s) provided.

Figure 18:
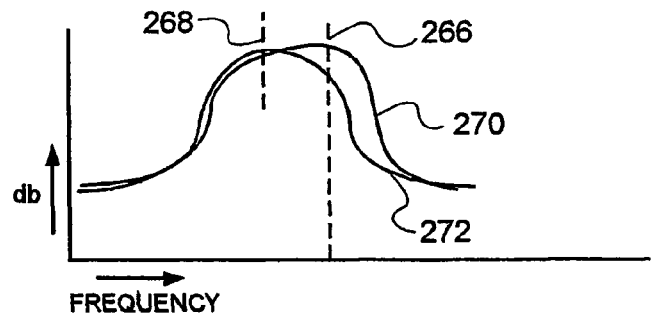
FIG. 18 is a graph of the frequency response of the system of FIG. 17 with an inductor tuned to an off-resonant transducer frequency, and a curve showing the response without the inductor.
Figure 19:
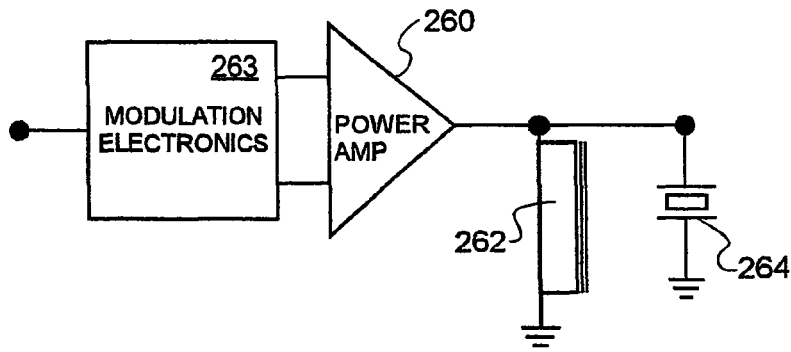
FIG. 19 is a parametric loudspeaker system with an inductor in parallel, tuned to an off-resonance transducer frequency.

As depicted in FIG. 18, the inductance of FIG. 17 is tuned to produce a reactance counteracting frequency which is at an off-resonant frequency 266. This shifts the acoustic output curve 272 from its original output to the acoustic output curve 270 created by tuning the inductor. This is valuable because it creates greater output at high frequencies which tend to attenuate. The inductance can also be tuned to move the reactance counteracting frequency to the resonant 268 frequency of the transducer. An audio frequency range which carries the audio signal is modulated onto the carrier frequency and passed to the transducer for reproduction. FIG. 19 illustrates that an inductance 262 can also be connected in parallel with the circuit and then tuned to the carrier frequency, a transducer off-resonant frequency, or the most preferred frequency of operation.

Over a narrow band, the transducer capacitance appears to disappear as a result of the added reactive components. However, the reactance values of the capacitance and inductance vary oppositely with frequency, so the reactance damping or cancellation occurs only over a narrow band. The magnitude of the reactance actually varies more abruptly than before. In fact, it theoretically can present a short circuit at the resonant frequency.

Figure 20:
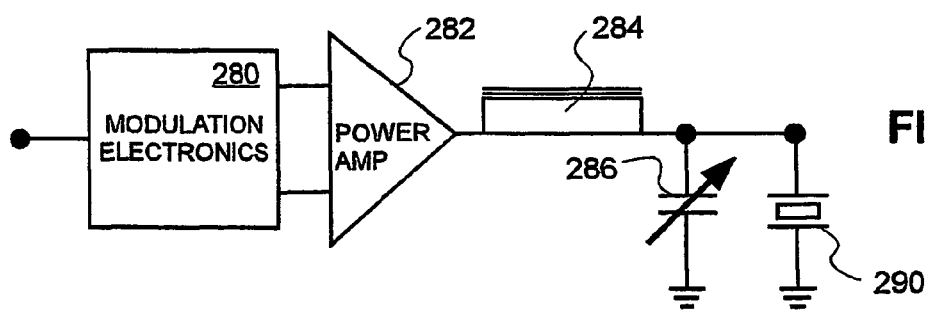
FIG. 20 is a parametric loudspeaker system with an inductor and variable capacitor to tune the frequency to an optimal frequency.

A better approach is to employ a reactive matching network comprised of a multiplicity of inductors and capacitors. Such a network includes a minimum of two inductors and one capacitor. This multiple element configuration for reactive circuitry elements is illustrated in FIG. 20. The modulation electronics 280 are coupled to the switching power amplifier 282 and reactive elements are coupled between the switching power amplifier and the transducer 290. The reactive elements in this configuration are an inductor in series 284 and a variable capacitor 286 in parallel. The preferred tuning for the inductor in this configuration (before the capacitor is taken into consideration) is to tune the inductor higher or lower than the resonant frequency of the transducer. Then the capacitor can be tuned to bring the frequency substantially close to or on the resonant frequency of the transducer. This provides an adaptable tuning that can be dynamically adjusted for parameter changes in the transducer, such as thermal dissipation, temperature, humidity, or barometric changes. The dynamic tuning also allows other frequencies to be maximized that are off the transducer resonant frequencies and for changes to the carrier frequency, when needed to track substantial changes in the transducers acoustic resonance.

Figure 21:
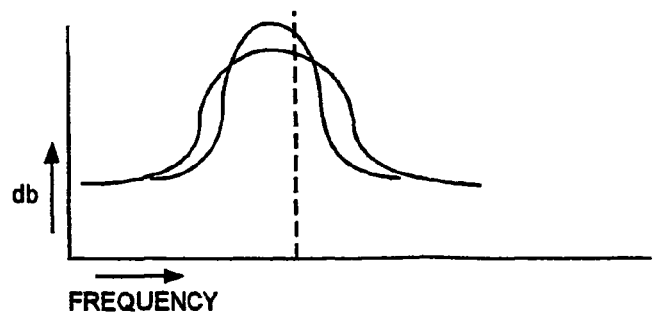
FIG. 21 is a graph of the frequency response curve for FIG. 20.

FIG. 21 illustrates the increased audio output when the frequency is tuned to be near the carrier or resonant frequency. Using a reactive matching network with a multiplicity of inductors and capacitors minimizes the power requirements for the amplifier.

Figure 22:
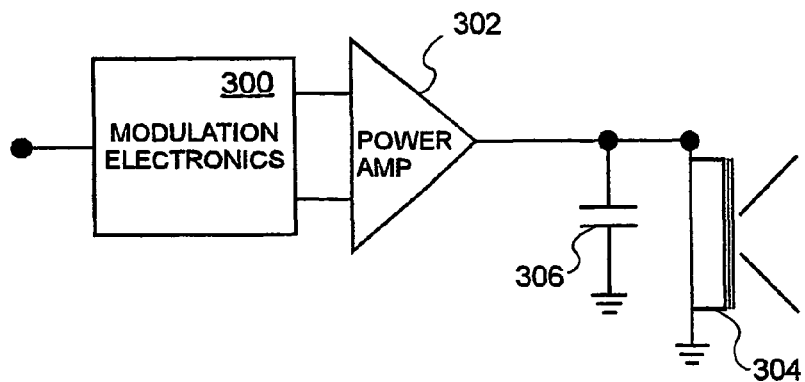
FIG. 22 is a schematic of a parametric loudspeaker with an inductive speaker and a parallel resonating capacitance.
Figure 23:
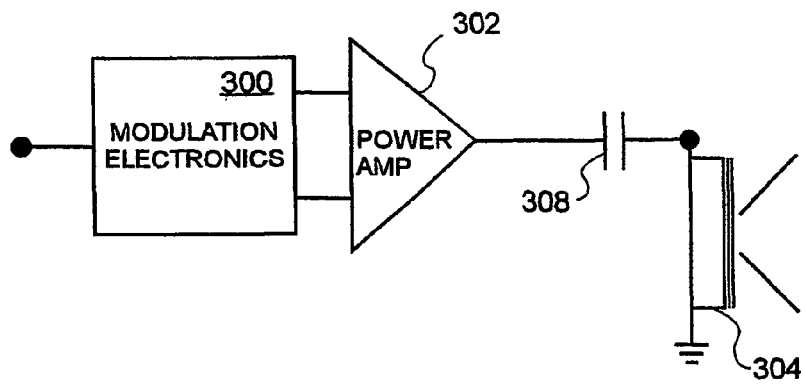
FIG. 23 is a schematic of a parametric loudspeaker system with an inductive speaker and a resonating capacitance in series.
Figure 24:
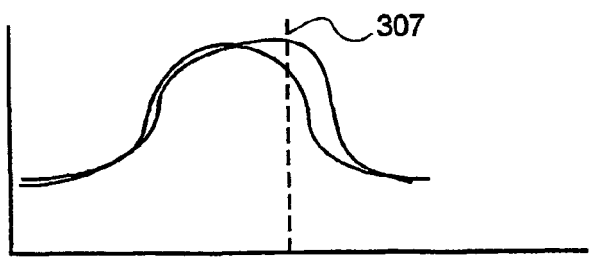
FIG. 24 is a graph of the frequency response curves of FIGS. 22 and 23 when reactive components are tuned to a frequency off-resonance of the transducer.
Figure 25:
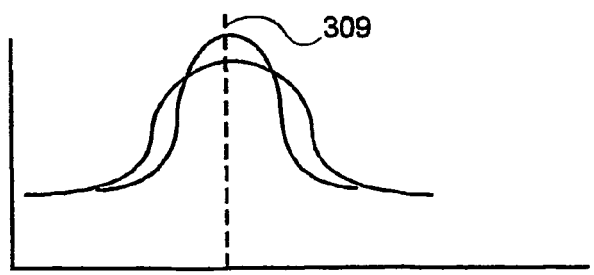
FIG. 25 is a graph of the frequency response curves of FIGS. 22 and 23 when the reactive components are tuned at the resonance of the transducer.

FIGS. 22 and 23 represent a parametric loudspeaker system with a predominantly inductive transducer. The modulation electronics 300 provide the ultrasonic carrier signal modulated with the audio sideband signal which is delivered to the linear or Class D power amplifier 302. The signal is delivered to the inductive transducer 304 through a reactive matching network. This transducer represents transducers such as electromagnetic voice coil transducers, magnetostrictive transducers, and similar transducers which exhibit an inductive load. Resonating capacitances 306 and 308 are used to tune each circuit to counteract the reactance in the inductive load at frequencies of interest. FIG. 22 shows a capacitance 306 in parallel and FIG. 23 shows a capacitance 308 in series. Both capacitances resonate with the inductive transducer and use the transducer inductance as part of the reactive matching network. FIG. 24 illustrates the use of the reactive network to tune the carrier frequency 307 off the resonant transducer frequency. FIG. 25 illustrates using the reactive matching network of FIGS. 22 and 23 to tune the signal frequency 309 to the carrier or resonant transducer frequency.

In the case of a Class D switching amplifier, the reactive matching network can be combined with the low pass filter normally employed to minimize electromagnetic interference (EMI), provide the proper filtering to minimize switching noise, and allow proper operation of the PWM function. Due to potential interaction, these elements would need to work together, even if designed separately. The reactive matching network can be designed to minimize the product of maximum voltage and maximum current required at the output of the amplifier. When the low pass filter is combined with the reactive matching network, the resulting network filter is designed to meet the needs of both the PWM network and counteracting the reactive load.

Figure 26:
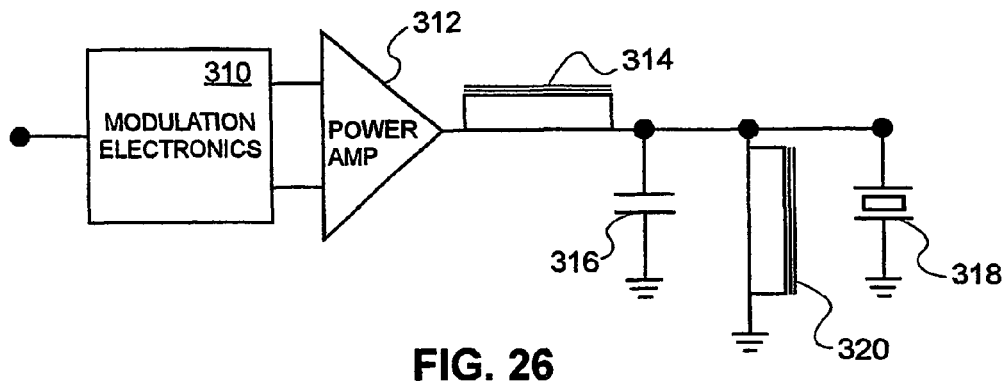
FIG. 26 is a schematic of a parametric loudspeaker system with reactive circuitry including a group of inductors and a capacitor.
Figure 27:
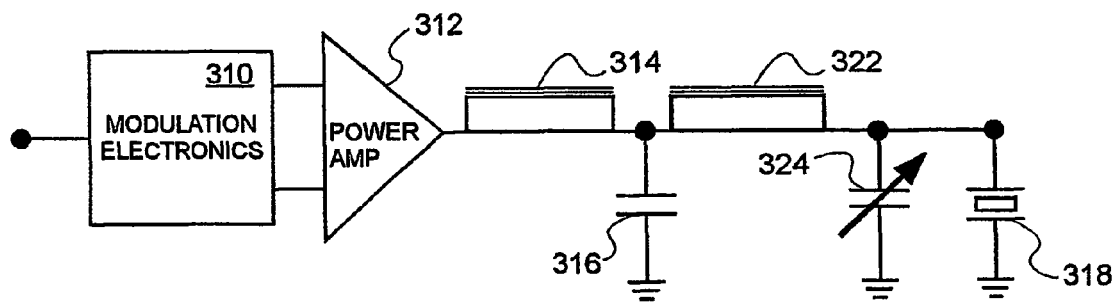
FIG. 27 is a schematic of a parametric loudspeaker system with reactive circuitry including a group of inductors and a group of capacitors.

As represented by the schematics of FIGS. 26 and 27, the modulation electronics 310 provide the ultrasonic carrier signal modulated with the audio related sideband signals which are then delivered to the power amplifier 312. The signal is delivered to the transducer 318 through a reactive matching network. Specifically, both reactive matching networks include at least one inductor in series 314 and one capacitor 316 in parallel. FIG. 26 includes an additional inductor 320 in parallel. Using groups of inductors and capacitors to counteract or counterbalance the reactive load is valuable in optimizing the power requirements of the amplifier. Multiple inductors and capacitors are preferably used because they can be tuned to counteract not only reactance for a narrow frequency range but also reactance over a broader range of frequencies. Similar to a multi-pole bandpass filter, it is also possible to tune multiple inductors and capacitors to counteract reactance even more dramatically over a very narrow range than is possible with a single inductor. Using a group of capacitors and inductors to counteract reactance over a broad or very narrow frequency range optimizes the amplifier s ability to drive the transducer. In contrast, a single inductor only has limited tuning or frequency control.

FIG. 27 includes an additional inductor in series 322 and a variable capacitor 324 in parallel as part of the reactive network. Using a variable capacitor allows the frequency tuning to be adjusted to certain frequencies desired to be reinforced. A reactive network with multiple elements is especially effective for a Class D amplifier but it can also be used with other types of amplifiers where the reactance of the load needs to be counteracted.

Figure 28:
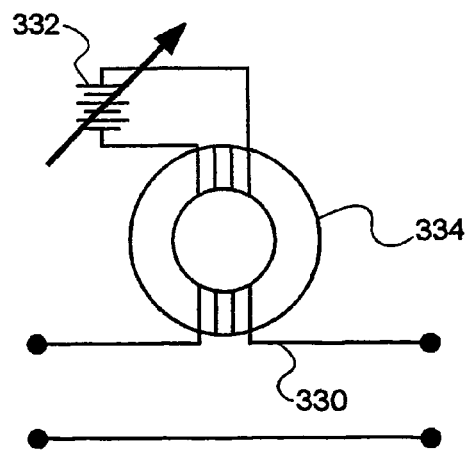
FIG. 28 is a variable saturable inductor for use in FIGS. 17, 19, 20, and 26-32.

FIG. 28 depicts a variable saturable inductor which can be substituted for or added to any of the inductors shown in the preceding figures. The inductor 330 included in the reactance circuit has a variable inductance as the power supplied 332 is changed. As the magnetic field of the permeable core is changed, the inductance in the reactive circuit fluctuates. A variable inductor can be controlled electronically and can be connected to a feedback loop in the circuit to determine what inductance values will optimize the reactance of the circuit at any given time.

Figure 29:
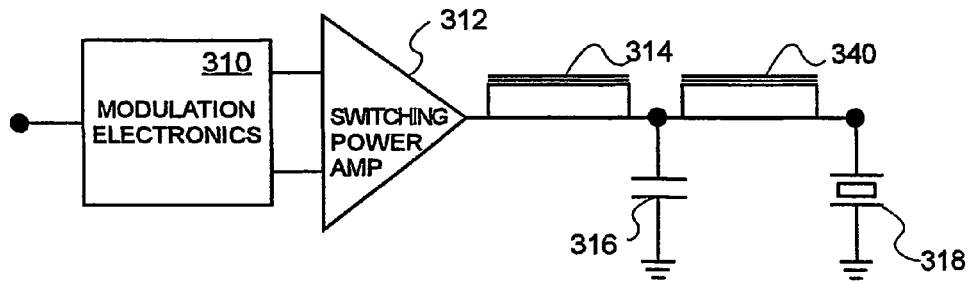
FIG. 29 is a schematic of a parametric loudspeaker system with reactive circuitry including a group of inductors in series and a capacitor in parallel.

FIGS. 29-32 illustrate several configurations for reactive matching networks. Each of FIGS. 29-32 include modulation electronics 310 to provide the ultrasonic carrier signal modulated with the audio sideband signals (single sideband or double sideband), which are then delivered to the switching power amplifier 312. The signal is delivered to the transducer 318 through a reactive matching network. Each of these circuits includes at least one series inductor 314 and one parallel capacitor 316. FIG. 29 shows the use of an additional inductor 340 in series with the other elements of the reactive matching network. In addition, the carrier frequency can be varied to accommodate changes the resonant frequency of the transducer that are related to changes in barometric pressure and altitude. The carrier frequency can be varied in order to maximize efficiency and output levels for parametric loudspeaker output.

Figure 30:
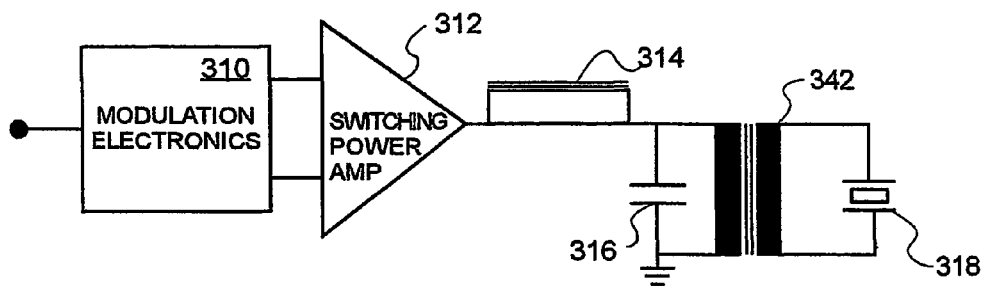
FIG. 30 depicts a parametric loudspeaker system with reactive circuitry including an inductor before a step-up transformer, a parallel capacitor, and an inductance contained in the transformer.
Figure 31:
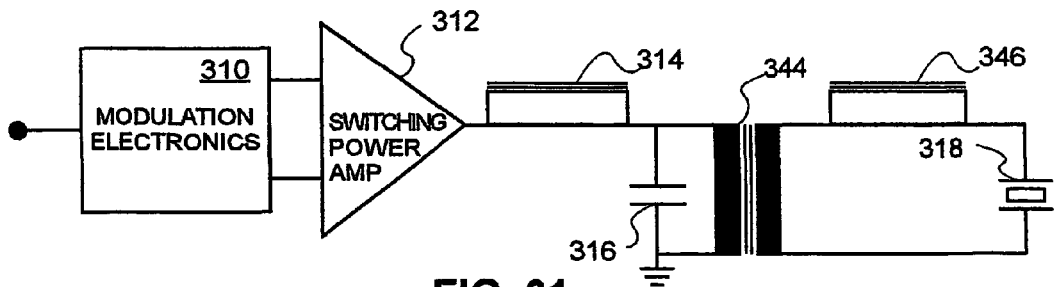
FIG. 31 is a schematic of a parametric loudspeaker system with reactive circuitry including an inductor before a step-up transformer, a parallel capacitor, and an inductor after the transformer.
Figure 32:
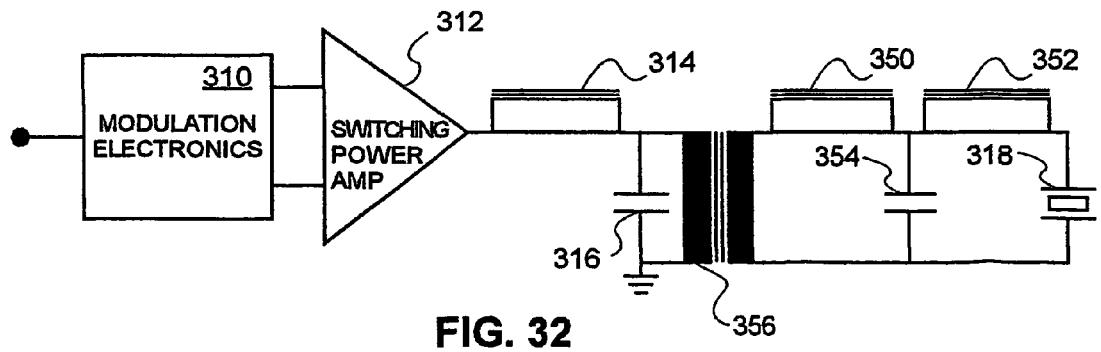
FIG. 32 is a schematic of a parametric loudspeaker system with reactive circuitry including an inductor and a parallel capacitor before the transformer and an inductor group and capacitor after the transformer.

Some or all of the required inductance can also be included in the matching transformer if desired. FIG. 30 shows a step-up or step-down transformer 342 which may include a portion of the desired inductance within the transformer. The inductance of the matching transformer is tuned to work with the other elements in the reactive matching network. FIG. 31 is a variation of FIG. 30 where the inductance 346 has been moved out of a transformer 344 to the transducer side of the transformer. FIG. 32 shows an inductor 314 and capacitor 316 used for reactive matching and a transformer 356 to scale the voltage. Additional elements of the reactive network between the transformer and the transducer are two inductors 350 and 352 and a resonant capacitor 354.

Figure 33:
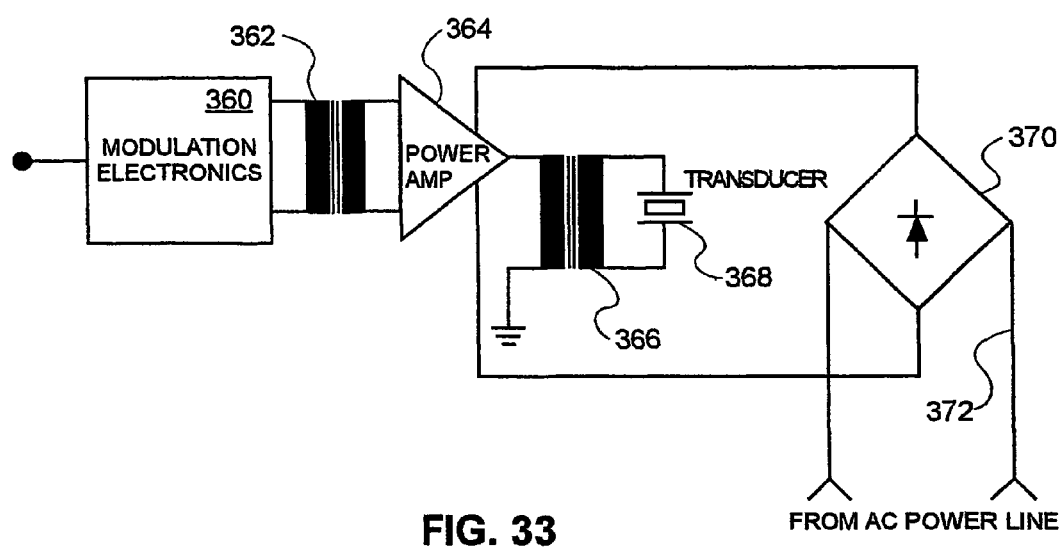
FIG. 33 is a schematic of a power transformer isolation configuration for a linear or switch-mode power amplifier.

Another issue with parametric transducers is the isolation of the AC power line from the load circuit. This large amount of power can be dangerous to users if the high voltage leads from the amplifier are exposed because a consumer might be seriously shocked. Conventional amplifier systems isolate the power amplifier from the AC power lines using an expensive power isolation transformer before the bridge rectifier. FIG. 33 illustrates a power amplifier configuration for isolating the power amplifier without using an expensive power isolation transformer. A parametric signal from the modulation electronics 360 is passed through a first isolation transformer 362 to the power amplifier 364. The power to the power amplifier is supplied by input power circuitry which is a bridge rectifier 370 connected to the AC power line 372. Then the amplified signal is passed from the power amplifier through a second isolation transformer 366 to the output transducer. This way the power amplifier and the two isolation transformers can be sealed in the same container, which is inaccessible to the user. The second transformer 366 can be a step-up, step-down or 1:1 transformer depending on the matching needs of the transducer such as electrostatic, piezoelectric or other transducer types. Isolating the power amplifier using two smaller transformers minimizes the cost and size of a parametric power amplifier by eliminating the typically larger and more costly power transformer or power isolation system. Another embodiment of this isolation configuration is to use an opto-isolator in the place of the input transformer.

One switching power amplifier embodiment uses a switched amplitude or multi-voltage level power amplifier.

An ultrasonic carrier frequency is modulated with audio to generate sideband signals, which along with the carrier are amplified by the switching power stage. An ultrasonic transducer is connected to the output of the power amplifier. A feature of the multi-level switching power stage is that it has multiple power supplies or transformer taps (see FIG. 35) and uses amplitude power switching to provide controlled power to, and minimize dissipation in, the output stage of an amplifier. A multi-level switching amplifier preferably includes at least two switchable power delivery levels per polarity.

Figure 34:
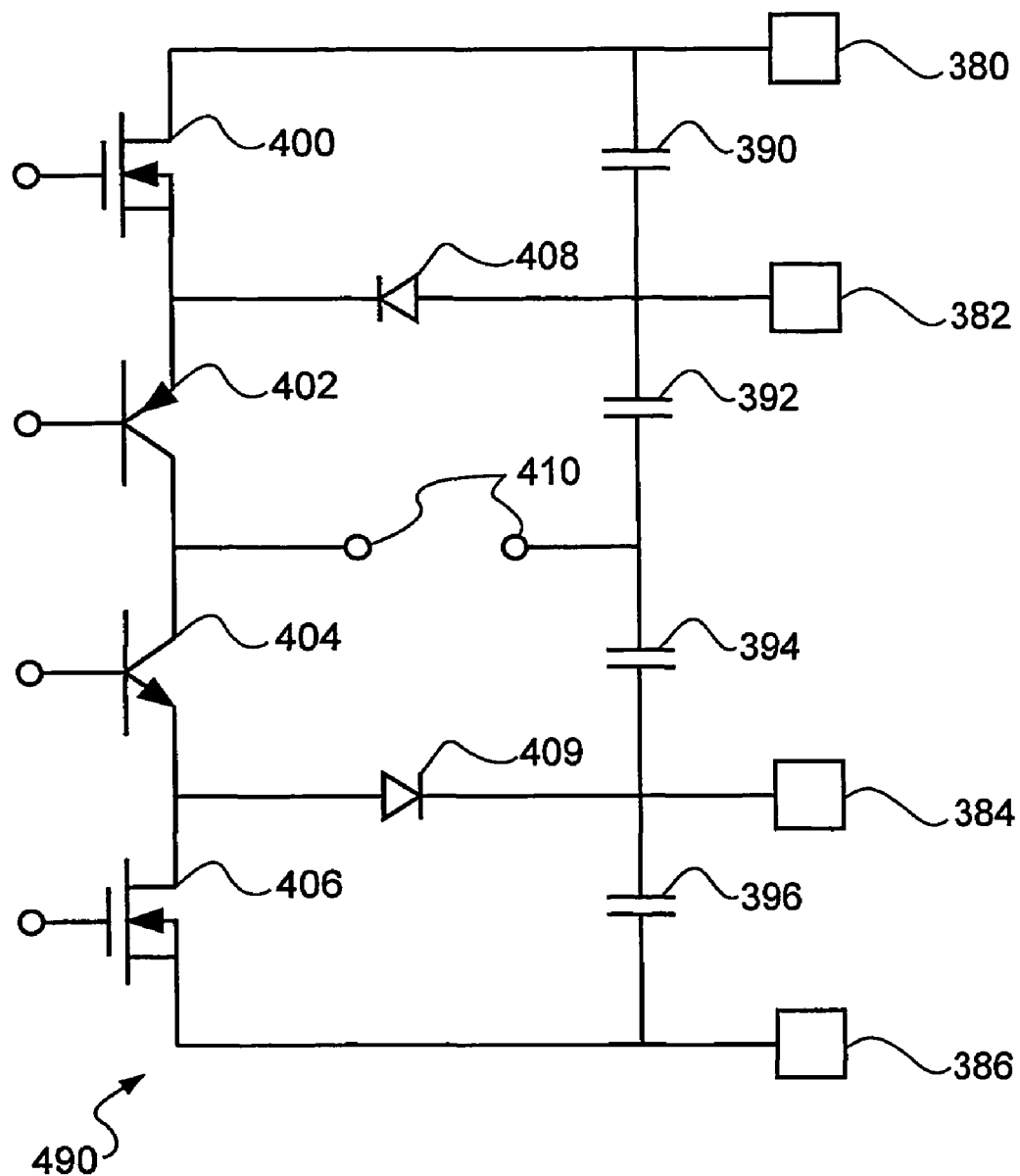
FIG. 34 illustrates a multilevel switching amplifier for parametric loudspeakers.

One embodiment of the multi-level switching amplifier for parametric loudspeakers is shown in FIG. 34. A power stage is illustrated that includes multiple level voltage supplies 380, 382, for one polarity and 384, 386 for the opposite polarity, in combination with the energy storage supply capacitors 390, 392, 394, 396.

At low program signal levels, transistors 402 and 404 operate the "inner" supplies 382 and 384 drawing current from supply capacitors 392 and 394. At higher levels, transistors 400 and 406 are switched on and the diodes 408 and 409 are reverse biased which terminates current flow through the circuit path that includes the diodes. This multi-level approach provides greater efficiency and reduced dissipation in the power stages. The outputs 410 from the switching power stage 490 can be coupled to a transducer. It should also be mentioned that the two power supplies for each polarity in FIG. 34 can also be three or more power supplies or two or more taps on an output coupling transformer for each polarity.

Figure 35:
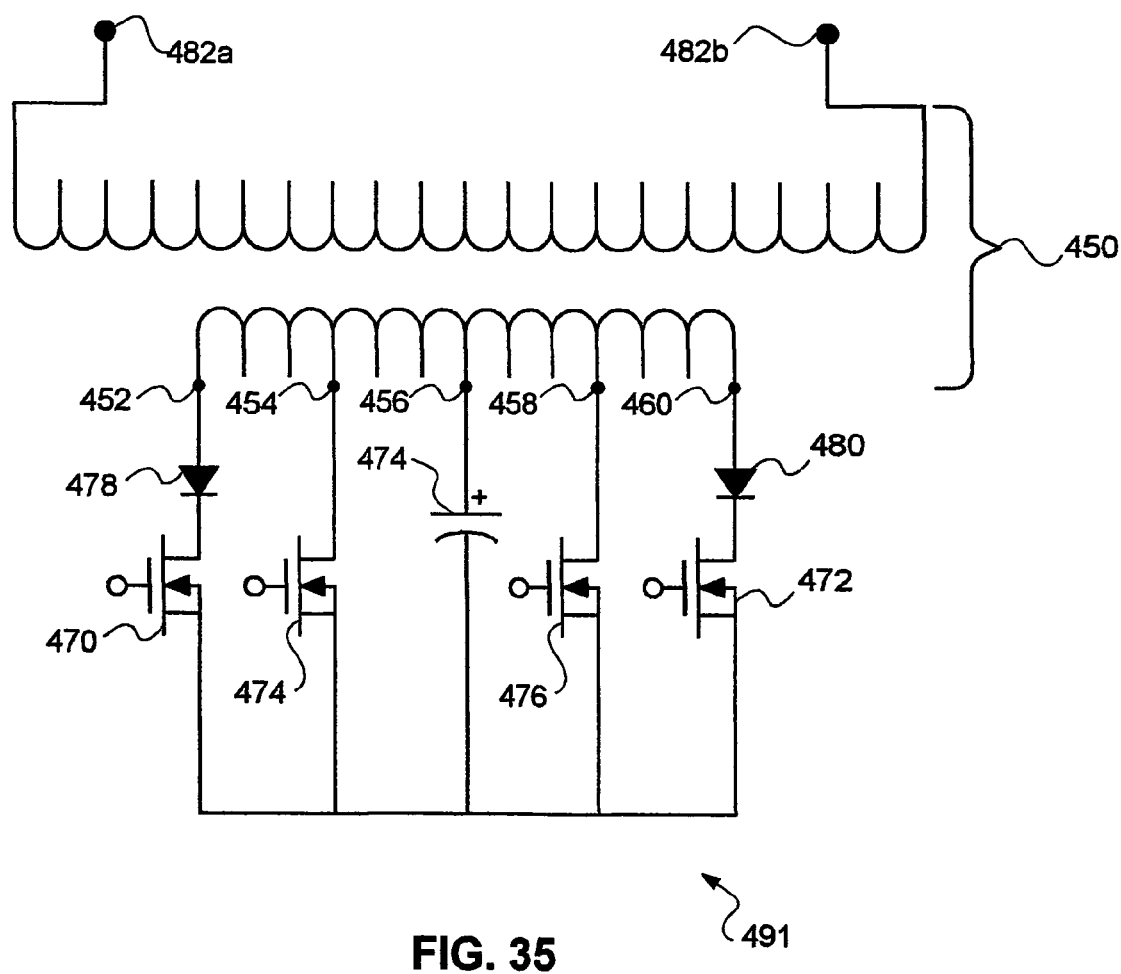
FIG. 35 illustrates a multi-level switching amplifier for parametric loudspeakers using an output coupling transformer.

Another embodiment of a multi-level switching amplifier for parametric loudspeakers is shown in FIG. 35. A transformer 450 is coupled to an amplifier with multiple level taps 452, 454, for one polarity and 458, 460, for the opposite polarity, and 456 as a center tap. This configuration provides output and efficiency advantages comparable to the system of FIG. 34, but only requires the use of a single energy storage supply capacitor 462.

At lower program signal levels, transistors 470 and 472 (shown as MOSFETS) operate through lower level transformer taps 452 and 460 drawing current from supply capacitor 462. At higher levels, transistors 474 and 476 are switched on and transistors 470 and 472 are switched off and diodes 478 and 480 are reverse-biased which terminates current flow through the circuit path that includes the diodes. This draws current from the two higher level voltage taps 454, 458. The outputs 482a and 482b from the transformer can be coupled to a transducer. This multi-level approach provides greater efficiency and reduced dissipation in the power stage 491.

In the multi-level power supply embodiments of FIG. 34, the 4 sets of power supplies can be replaced with 4 sets of taps on a transformer output. This replaces the power supplies in the same manner as the four supplies of FIG. 34 are replaced with the four taps of FIG. 35.

The systems discussed relative to FIG. 34 may have the low levels set by the power supply voltages of 382 and 384 and FIG. 35 may have the low level set by the ratio of turns of the lower taps 454 and 458 compared to the upper taps 452 and 460. The selection of power levels may be chosen based on a number of parameters such as the predicted average levels of operation, the peak to average ratio of the program material, etc. A preferred embodiment is to set the high to low voltage ratios to be two to one. In addition, the multiple power level configurations can be combined with the power amplifier configuration for isolating the power amplifier without using a power isolation transformer. The combination of both of these configurations provides multiple power levels that are isolated from user access, reduced size, reduced weight and reduced cost.

With the systems shown in FIGS. 34 and 35, significant improvements in power amplifier efficiency can be achieved over prior art parametric loudspeaker power amplifiers.

Even more complex multiple power level, switched amplitude embodiments can be designed, such as the implementation of a multi-bit power amplifier. For example, there may be 4 separate power supplies for each polarity that produce 2 times 4 power supply levels, but when used in a multi-bit approach they provide two times 16 power supply levels. These power supplies can be used in various combinations to provide different power levels. In a multi-bit power supply, there can be four power supplies which each have a power switch (e.g., a MOSFET). Any number of these switches can be on or off in various combinations so that there are $2^4$ or 16 power supply levels. This is advantageous because there can be up to $2^N$ power supply levels with only N actual power supplies. Multiple voltage levels keep the voltage across the output stage at a minimum voltage and minimize the power dissipation in the amplifier. Each power supply can be twice the voltage of the preceding power supply. So if there are 4 power supplies, their voltages will be N, 2N, 4N and 8N volts (e.g., 10V, 20V, 40V and 80V). Furthermore, two positive and two negative power supply levels can be used.

It should be noted that to those skilled in the art, the term switching power amplifier refers to the many different approaches and names that are known in the switch-mode power conversion art that include but are not limited to Class D, Class AD, Class BD, two state amplifiers, three state amplifiers, digital power amplifiers, pulse width modulation (PWM), pulse duration modulation (PDM), switched amplitude amplifier, signal tracking amplifiers, class "G", class "H", multi-bit, and switch-mode power amplifiers.

The power amplifier embodiments of the invention as disclosed have significant efficiency improvements and/or size and cost reductions when compared to prior art parametric loudspeaker power amplifiers.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements. Thus, while the present invention has been shown in the drawings and fully described above with particularity and detail in connection with what is presently deemed to be the most practical and preferred embodiment(s) of the invention, it will be apparent to those of ordinary skill in the art that numerous modifications, including, but not limited to, variations in size, materials, shape, form, function and manner of operation, assembly and use may be made, without departing from the principles and concepts of the invention as set forth in the claims.

What is claimed is:

1. A power amplifier system to provide improved power efficiency in a parametric loudspeaker system, comprising:
   (a) a switching power stage in the power amplifier;
   (b) wherein a carrier frequency signal can be amplified by the switching power stage;
   (c) and wherein an audio frequency range signal giving rise to at least one corresponding sideband frequency signal different from the carrier frequency signal when the carrier signal is modulated by the audio frequency range signal can be used to modulate the carrier and a corresponding at least one sideband frequency is also amplified by the switching power stage;
   (d) at least one transducer, electrically coupled to the power amplifier; and, (e) wherein a switching frequency of the switching power stage is less than ten times the highest frequency of a modulated carrier frequency signal to be reproduced in the parametric loudspeaker system.

2. A parametric loudspeaker system as in claim 1, wherein the switching power stage utilizes pulse width modulation.

3. A parametric loudspeaker system as in claim 1, wherein the switching power stage operates as a Class D amplifier.

4. A parametric loudspeaker system as in claim 1, wherein the switching power stage has a switching frequency which corresponds to the carrier frequency of the parametric loudspeaker system and integer multiples thereof, within a frequency tolerance limit.

5. A parametric loudspeaker system as in claim 4, wherein the switching frequency is substantially an integer multiple of a carrier frequency of the parametric loudspeaker system.

6. A parametric loudspeaker system as in claim 4, wherein the power amplifier operates in a three-state mode and the switching frequency of the switching power stage is substantially an even integer multiple of a carrier frequency of the parametric loudspeaker system.

7. A parametric loudspeaker system as in claim 6, wherein the switching frequency is a frequency of the parametric loudspeaker system selected from the group consisting of: 2, 4, 6, and 8 times a carrier frequency.

8. A parametric loudspeaker system as in claim 4, wherein the power amplifier operates in a two-state mode and the switching frequency of the switching power stage is substantially an odd integer multiple of a carrier frequency of the parametric loudspeaker system.

9. A parametric loudspeaker system as in claims 8, wherein the switching frequency is a frequency of the parametric loudspeaker system selected from the group consisting of: 1, 3, 5, 7, and 9 times a carrier frequency.

10. A parametric loudspeaker system as in claim 4 wherein the switching frequency of the switching power stage corresponds substantially to a multiple of a carrier frequency of the parametric loudspeaker system within a frequency tolerance limit corresponding to a lowest audible frequency limit of the parametric loudspeaker system.

11. A parametric loudspeaker system as in claim 10, wherein the lowest audible frequency limit of the parametric loudspeaker system is approximately 300 Hz and the frequency tolerance limit is less than 300 Hz.

12. A parametric loudspeaker system as in claim 10, wherein the frequency tolerance limit is less than the lowest audible frequency limit.

13. A parametric loudspeaker system as in claim 10, wherein the frequency tolerance limit is less than or equal to an integer corresponding to the number of times larger the switching frequency is than the carrier frequency times the lowest audible frequency limit.

14. A parametric loudspeaker system as in claim 10, wherein the frequency tolerance limit is determined by $$T_L <= (xC) * LFL$$

wherein
$T_L$ is the frequency tolerance limit;
(xC) is the multiple of the carrier being used;
LFL is the lowest frequency tolerance limit.

15. A system as set forth in claim 4 further comprising at least one reactive circuitry element coupled between the switching power stage and the at least one transducer.

16. The parametric loudspeaker system as in claim 15, wherein the at least one reactive circuitry element is adapted to counteract a reactive load of the transducer at a frequency corresponding to the carrier frequency.

17. The parametric loudspeaker system as in claim 15, wherein the transducer further comprises a resonant frequency and the at least one reactive circuitry element is adapted to counteract a reactive load of the transducer at a frequency corresponding to the resonant frequency.

18. A parametric loudspeaker system as in claim 15, wherein the transducer further comprises a resonant frequency and the at least one reactive circuitry element is adapted to counteract a reactive load of the transducer at a frequency corresponding to an off resonant frequency within an ultrasonic frequency range of the parametric loudspeaker system.

19. A power amplifier system to provide improved power efficiency in a parametric loudspeaker system, comprising:
(a) a switching power stage in the power amplifier;
(b) wherein an ultrasonic carrier frequency signal can be amplified by the switching power stage;
(c) and wherein an audio frequency range is used to modulate the carrier frequency signal so as to have at least one corresponding sideband frequency divergent from the carrier frequency in a modulated ultrasonic carrier frequency signal which can be likewise amplified;
(d) at least one transducer configured for parametric signal reproduction, electrically coupled to the power amplifier; and
(e) wherein the switching frequency in the switching power stage is less than ten times the highest frequency to be parametrically reproduced at the transducer based on the modulated carrier signal.

20. A parametric loudspeaker system as in claim 19, wherein the switching power stage has multiple power levels and uses switched amplitude power levels to provide power to a linear output stage.

21. A parametric loudspeaker system as in claim 20, wherein the switching power stage has at least two switched amplitude power levels.

22. A parametric loudspeaker system as in claim 19, further comprising an output coupling transformer including a lower level voltage tap and a higher level voltage tap at a first polarity and a lower level voltage tap and a higher level voltage tap at a second polarity that is opposite to the first polarity.

23. A parametric loudspeaker system as in claim 20, wherein the multiple power levels are provided by at least two positive transformer taps and at least two negative transformer taps.

24. A parametric loudspeaker system as in claim 20, wherein the multiple power levels include at least two positive and two negative power supply levels.

* * * * *